US008546924B2

(12) United States Patent
Yu et al.

(10) Patent No.: US 8,546,924 B2

(45) Date of Patent: Oct. 1, 2013

(54) PACKAGE STRUCTURES FOR INTEGRATING THERMOELECTRIC COMPONENTS WITH STACKING CHIPS

(75) Inventors: Chih-Kuang Yu, Chiayi (TW); Chun-Kai Liu, Taipei (TW); Ra-Min Tain, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 390 days.

(21) Appl. No.: 12/849,774

(22) Filed: Aug. 3, 2010

(65) Prior Publication Data

US 2011/0042805 A1 Feb. 24, 2011

(30) Foreign Application Priority Data

Aug. 19, 2009 (TW) ............................... 98127816 A

(51) Int. Cl.
*H01L 23/02* (2006.01)

(52) U.S. Cl.
USPC ........... 257/678; 257/720; 257/706; 257/707; 257/37; 257/E23.068; 438/106; 438/122; 438/126

(58) Field of Classification Search
USPC ................... 257/737, 37, 720, 707, 706, 686, 257/678, E23.068; 438/106, 122, 126
See application file for complete search history.

(56) References Cited

U.S. PATENT DOCUMENTS

| | | | | |
|---|---|---|---|---|
| 5,936,192 | A | 8/1999 | Tauchi | |
| 6,043,982 | A | 3/2000 | Meissner | |
| 6,588,214 | B2 | 7/2003 | Mack et al. | |
| 6,588,217 | B2 | 7/2003 | Ghoshai | |
| 7,235,735 | B2 | 6/2007 | Venkatasubramanian et al. | |
| 7,250,327 | B2 | 7/2007 | Sakamoto | |
| 7,301,233 | B2 | 11/2007 | Lee et al. | |
| 7,352,063 | B2 | 4/2008 | Noguchi | |
| 2006/0097383 | A1 * | 5/2006 | Ramanathan et al. | 257/712 |

FOREIGN PATENT DOCUMENTS

| | | |
|---|---|---|
| TW | 200802741 | 1/2008 |

OTHER PUBLICATIONS

Taiwan Patent Office, Office Action, Patent Application Serial No. 098127816, Oct. 30, 2012, Taiwan.

* cited by examiner

*Primary Examiner* — Eugene Lee
*Assistant Examiner* — Elias M Ullah

(57) ABSTRACT

Package structures for integrating thermoelectric components with stacking chips are presented. The package structures include a chip with a pair of conductive through vias. Conductive elements are disposed one side of the chip contacting the pair of conductive through vias. Thermoelectric components are disposed on the other side of the chip, wherein the thermoelectric component includes a first type conductive thermoelectric element and a second type conductive thermoelectric element respectively corresponding to and electrically connecting to the pair of conductive through vias. A substrate is disposed on the thermoelectric component, wherein the thermoelectric component, the pair of conductive through vias and the conductive element form a thermoelectric current path. Therefore, heat generated from the chip is transferred outward through a thermoelectric path formed from the thermoelectric components, the conductive through vias and the conductive elements.

16 Claims, 10 Drawing Sheets

200h 226 226 224 222 224 222 230 220 210 214 212 244 218 242 240 246

PACKAGE STRUCTURES FOR INTEGRATING THERMOELECTRIC COMPONENTS WITH STACKING CHIPS

CROSS REFERENCE TO RELATED APPLICATIONS

This application is based upon and claims the benefit of priority from a prior Taiwanese Patent Application No. 098127816, filed on Aug. 19, 2009, the entire contents of which are incorporated herein by reference.

TECHNICAL FIELD

The disclosure relates to a package structure for integrating a thermoelectric component with a chip, and in particular to, a package structure for integrating a thermoelectric component with a stack of chips.

BACKGROUND

Electronic component and packaging manufacturing trends include more high-powered, high-density, low cost, and high-precision processes. However, as technological advances increase, so does the challenges. For example, a critical issue encountered by 3D stacked integrated circuits (3D stacked IC) manufacturing is the heat dissipation issue. In the 3D stacked IC chip, a local high-temperature region and hot spots are formed, resulting in temperature and stress concentration phenomena and derived thermal stress problems. The thermal stress problems may further affect reliability of the 3D stacked IC chip, thereby hindering application.

Aforesaid hot spot issues inside chips, substantially increase requirement for thermal dissipation components. The thermal resistance for thermal dissipation components should be low to prevent severe heat dissipation problems. Particularly, in a 3-D stacked IC chip, the generated heat will accumulate at the chip stack such that the amount of heat generated per unit area also increases, resulting in serious heat problems. Therefore, it is important to transfer out heat generated by the 3-D stacked IC chip.

SUMMARY

According to one embodiment, a package structure comprises a chip with a pair of conductive through vias; a conductive element disposed on one side of the chip contacting the pair of conductive through vias; a thermoelectric component disposed on the other side of the chip, wherein the thermoelectric component comprises a first type conductive thermoelectric element and a second type conductive thermoelectric element respectively corresponding to and electrically connecting to the pair of conductive through vias; and a substrate disposed on the thermoelectric component, wherein the thermoelectric component, the pair of conductive through vias and the conductive element form a thermoelectric current path.

According to another embodiment, a package structure comprises a substrate having a conductive element thereon; a stack of multi-layered chips disposed on the substrate and electrically connected to the conductive element, wherein each chip of the stack of multi-layered chips has a plurality of conductive through vias, and wherein at least two of the conductive through vias of adjacent chips are connected by a first conductive bump; a thermoelectric component disposed on the stack of multi-layered chips corresponding to and electrically connecting to the conductive through vias; and a hot-end substrate disposed on the thermoelectric component.

According to another embodiment, a package structure comprises a substrate; a stack of multi-layered chips disposed on the substrate, wherein each chip of the stack of multi-layered chips has a plurality of conductive through vias, and wherein at least two of the conductive through vias of adjacent chips are connected by a first conductive bump; a thermoelectric component disposed between the stack of multi-layered chips and the substrate corresponding to and electrically connecting to the conductive through vias; and a conductive layer disposed on the other side of the stack of multi-layered chips and electrically connected to the conductive through vias.

According to another embodiment, a package structure comprises a first substrate; a stack of multi-layered chips disposed on the first substrate, wherein each chip of the stack of multi-layered chips has a plurality of conductive through vias, and wherein two of the conductive through vias of adjacent chips are electrically connected; a thermoelectric component comprising first type conductive thermoelectric elements and second type conductive thermoelectric elements, wherein the conductive thermoelectric elements are disposed on the upper and lower sides of the stack of multi-layered chips and respectively corresponding to and electrically connecting to the conductive through vias; a second substrate disposed on the stack of multi-layered chips; and wherein the conductive thermoelectric elements disposed between the first substrate and the stack of multi-layered chips are connected by a first conductive layer, and wherein the conductive thermoelectric elements disposed between the second substrate and the stack of multi-layered chips are connected by a second conductive layer.

BRIEF DESCRIPTION OF THE DRAWINGS

The invention can be more fully understood by reading the subsequent detailed description and examples with references made to the accompanying drawings, wherein.

DETAILED DESCRIPTION

Figure 1A:
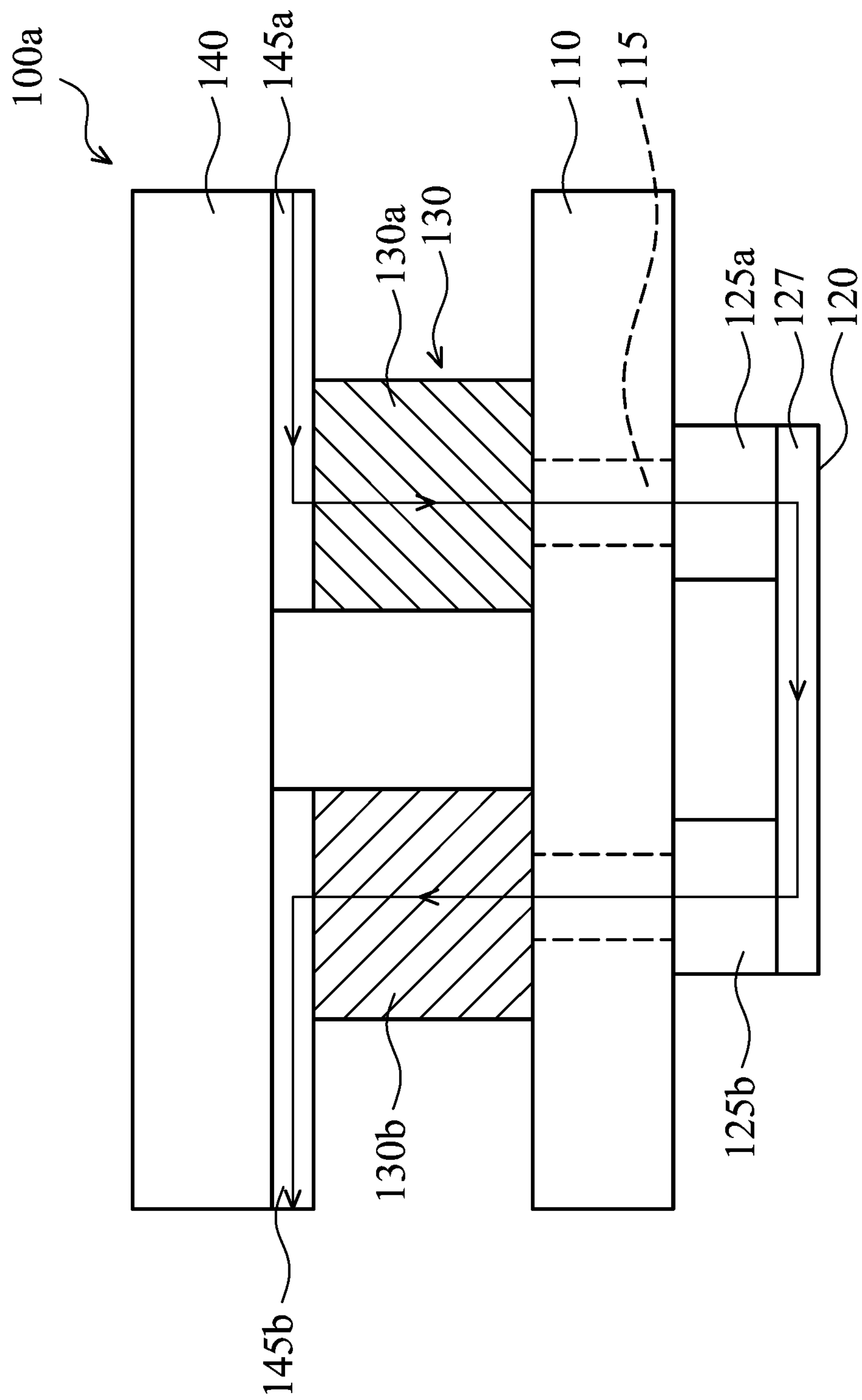
FIGS. 1A and 1B are cross sections of embodiments of the package structures for integrating a thermoelectric component with a chip.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself indicate a relationship between the various embodiments and/or configurations discussed. Moreover, the formation method for a first feature over or on a second feature in the description that follows may include embodiments in which the first and second features are formed in direct contact or not in direct contact.

According to key aspects and main features of the invention, a package structure for integrating an active thermoelectric component with stacking chips is disclosed. In some embodiments, a plurality of conductive through vias which penetrate the chips and micro-bump structures between each stacked chips can serve as cold-end electrodes of the thermoelectric component. During operation, heat generated inside of the stacked IC chips is transferred out by the thermoelectric component. In another embodiment, the TEC has cold- and hot-end heat dissipation paths during operating. The cold-end heat dissipation path can be formed by having "conductive through vias", "micro-bump structures", and "conductive elements" connected to columns of the TEC.

Figure 1B:
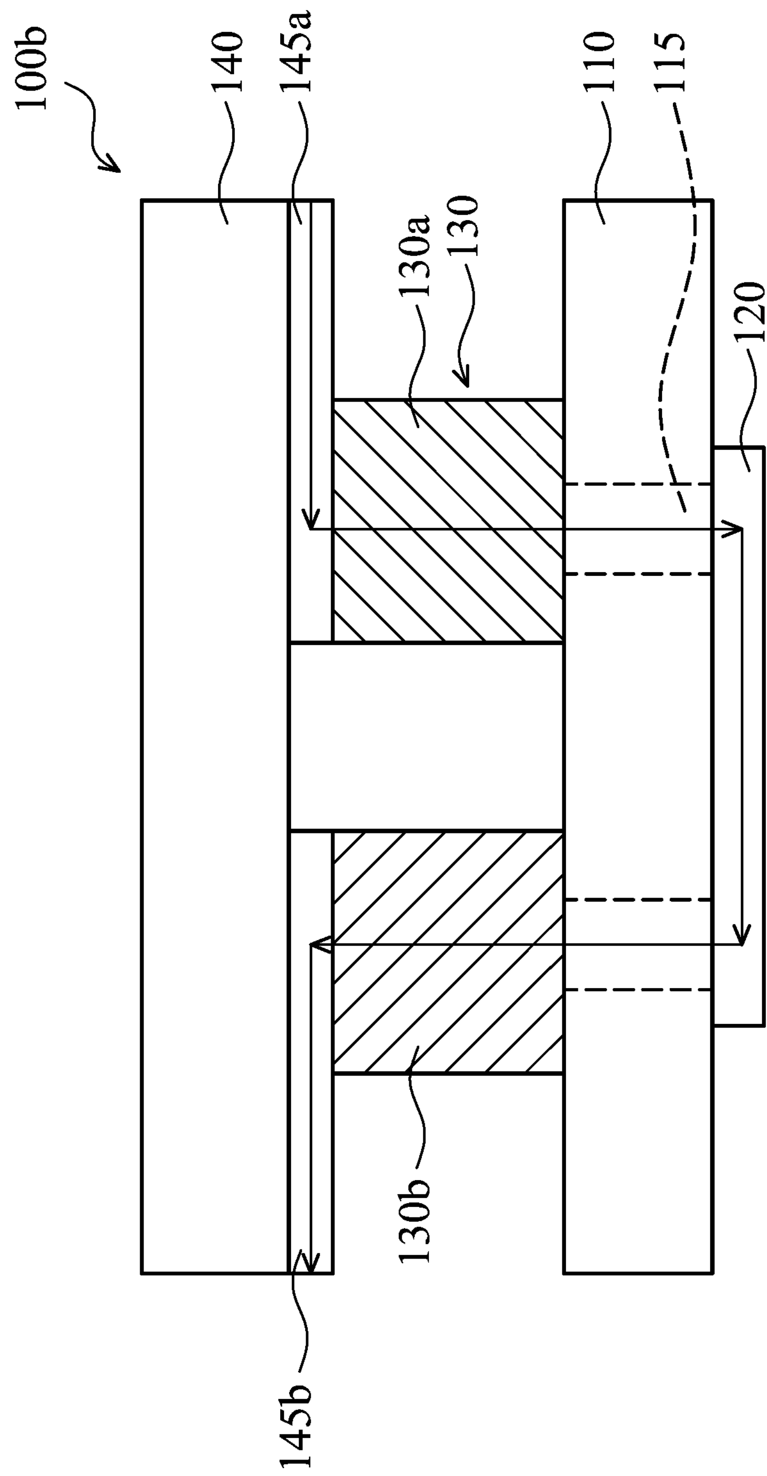

FIGS. 1A and 1B are cross sections of an embodiment of the package structure for integrating a thermoelectric component with a chip. Referring to FIG. 1A, a package structure 110*a* includes a chip 110, made of material such as a silicon substrate, with integrated circuit devices formed thereon. The chip 110 has one or more conductive through vias 115 such as through silicon vias (TSV) that penetrate the silicon substrate. A conductive element 120 includes a pair of conductive bumps 125*a* and 125*b* respectively corresponding to and electrically connected to the conductive through vias 115. In one embodiment, the conductive element 120 can further include a conductive layer 127 which is disposed on one side of the chip 110, and the pair of conductive bumps 125*a* and 125*b* is connected by the conductive layer 127 and is electrically connected to the conductive through vias 115. A thermoelectric component 130 comprises a first type conductive thermoelectric element 130*a* and a second type conductive thermoelectric element 130*b* disposed on the other side on the chip 110 and respectively corresponding to the pair of conductive bumps 125*a* and 125*b*. In one embodiment, the first and second type conductive thermoelectric elements 130*a* and 130*b* (e.g., respectively shown as an N-type semiconductor element and a P-type semiconductor element, or vice versa) respectively corresponds to the conductive through vias 115. A carrier substrate 140 is disposed on the thermoelectric component 130. Conductive traces 145*a* and 145*b* disposed on the carrier substrate 140 create a thermoelectric current path (indicated as an arrow) through the thermoelectric component 130, the pair of conductive through vias 115, and the conductive element 120, thereby transferring heat generated by the chip outward. When operating, the carrier substrate can serve as a hot-end substrate with high thermal conductivity and with electrical isolation.

Figure 5:
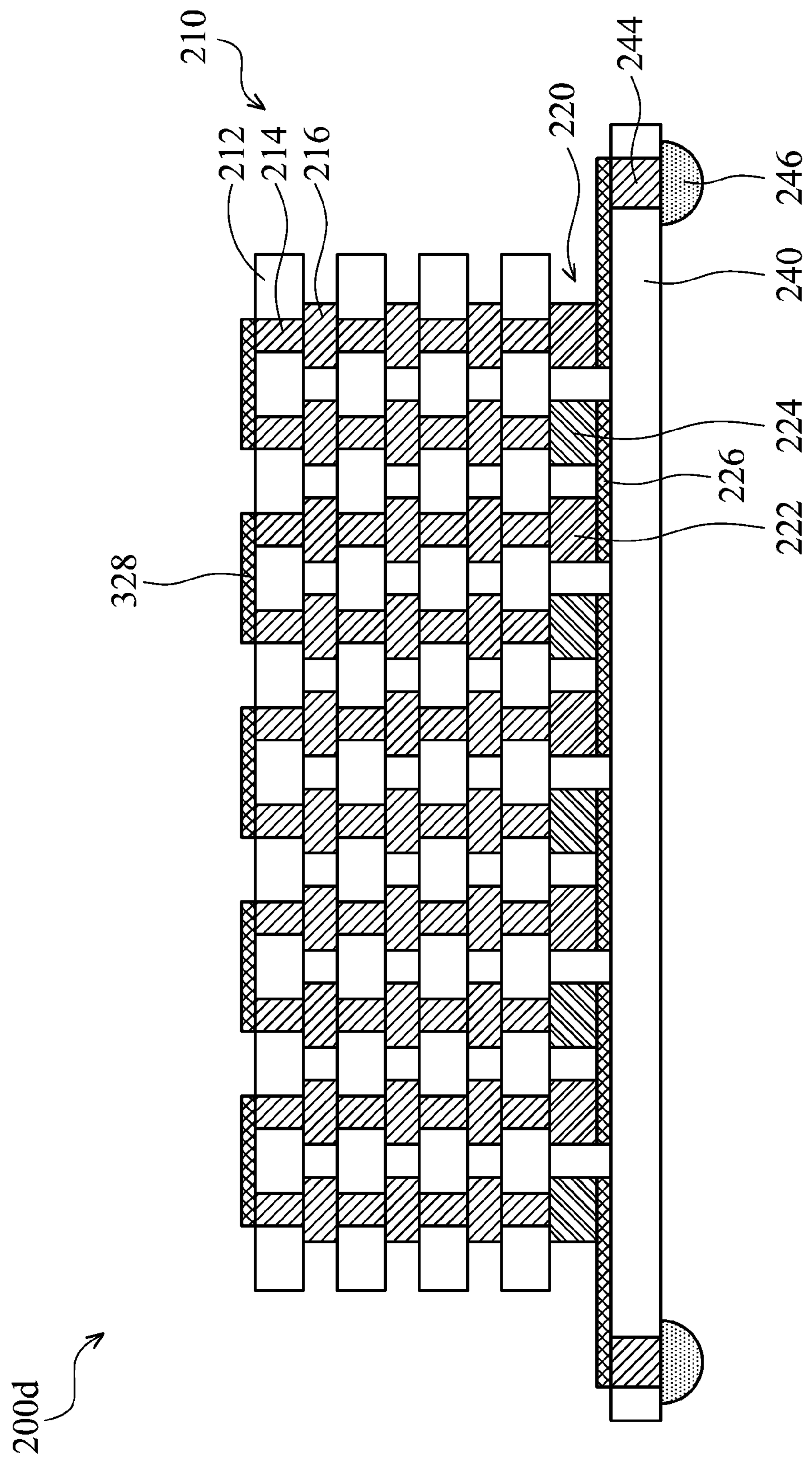
Figure 6:
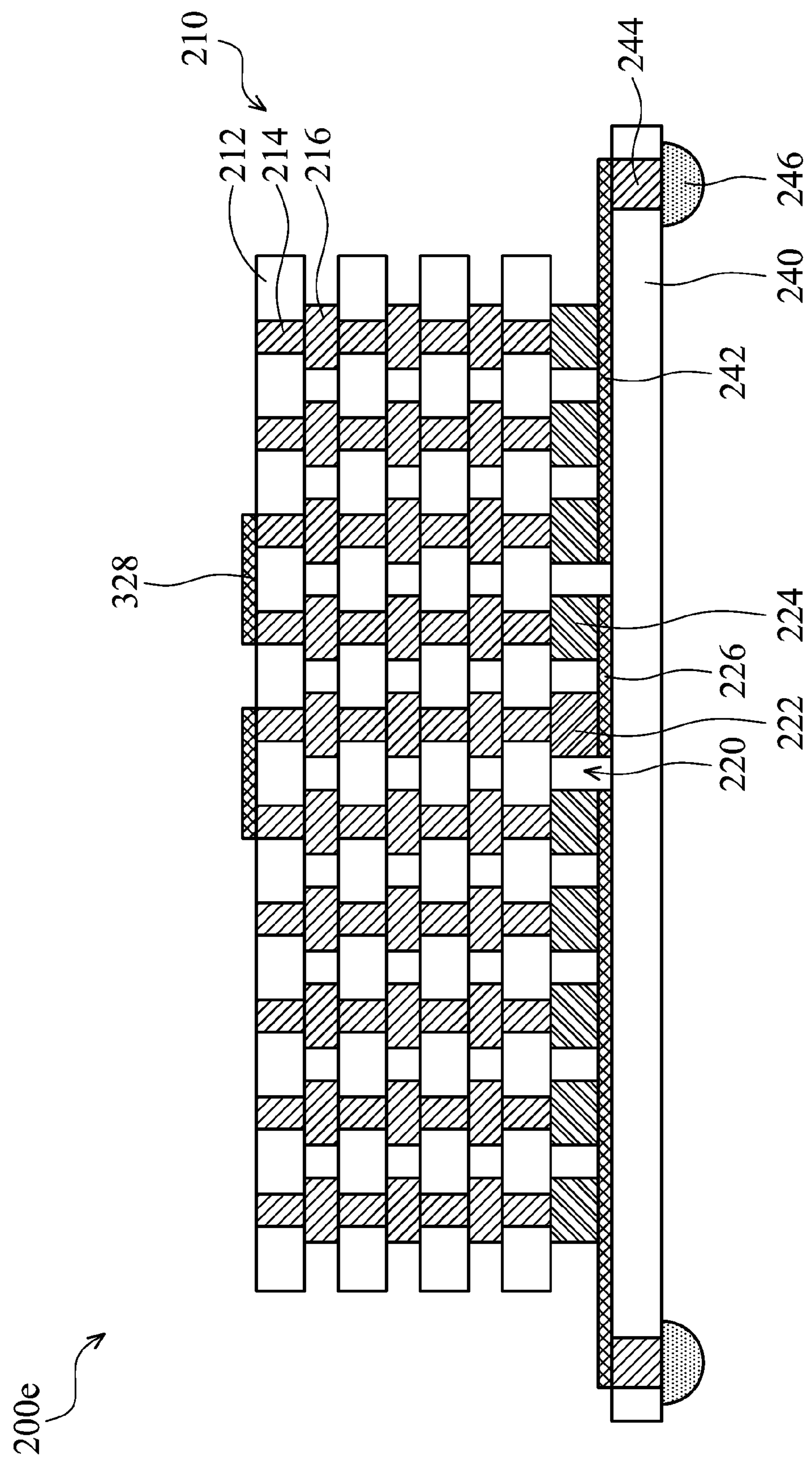
Figure 7:
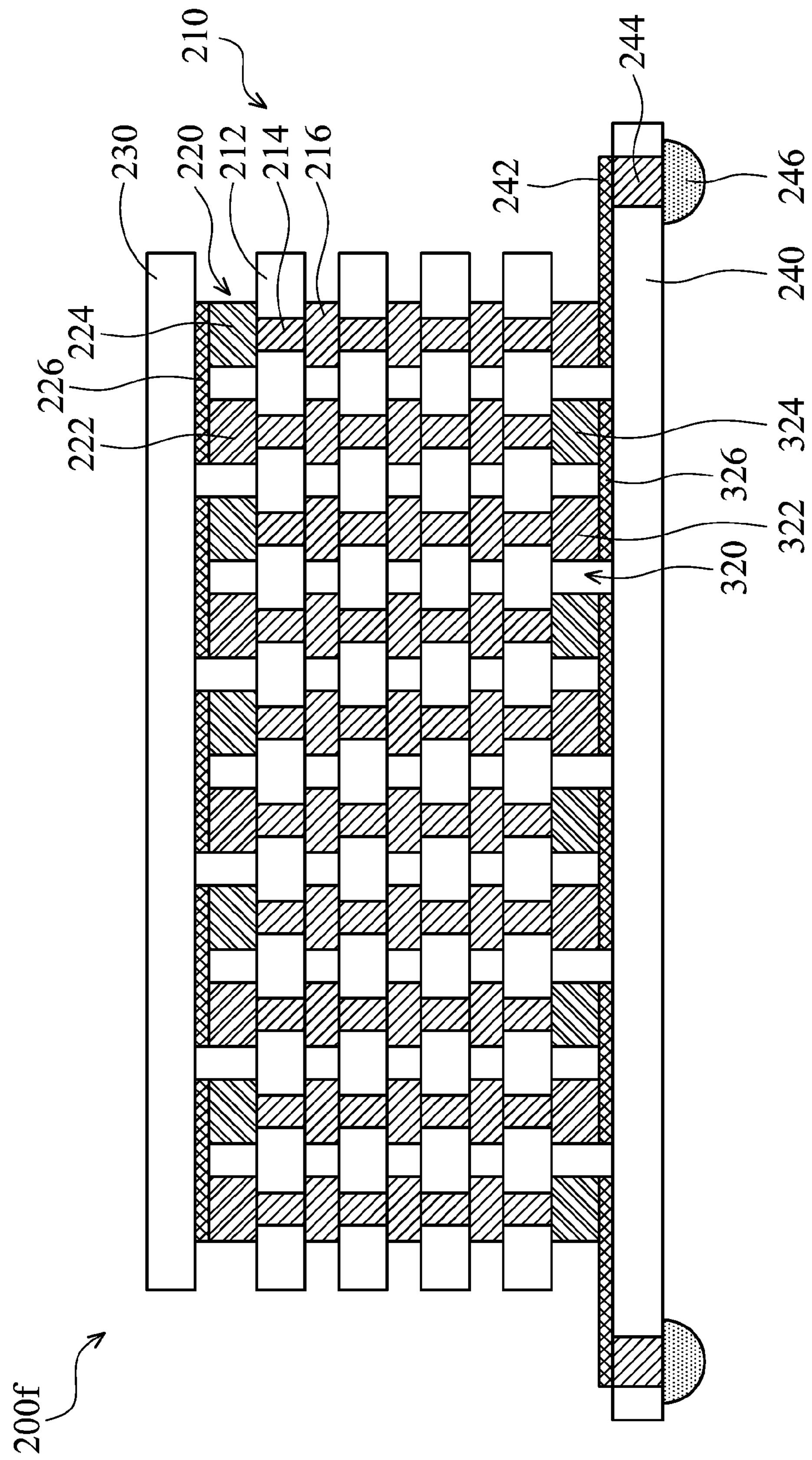
Figure 8:
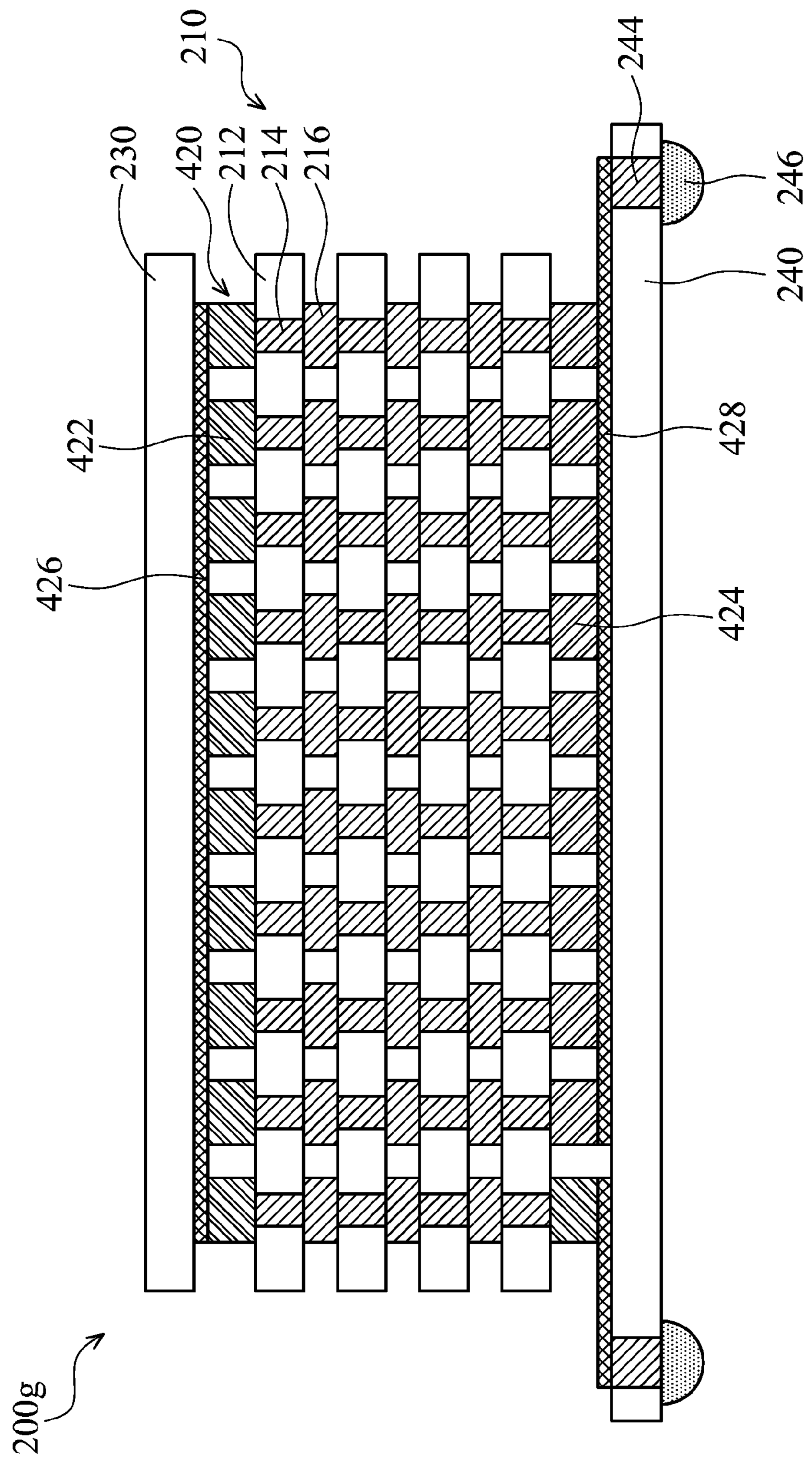
Figure 9:
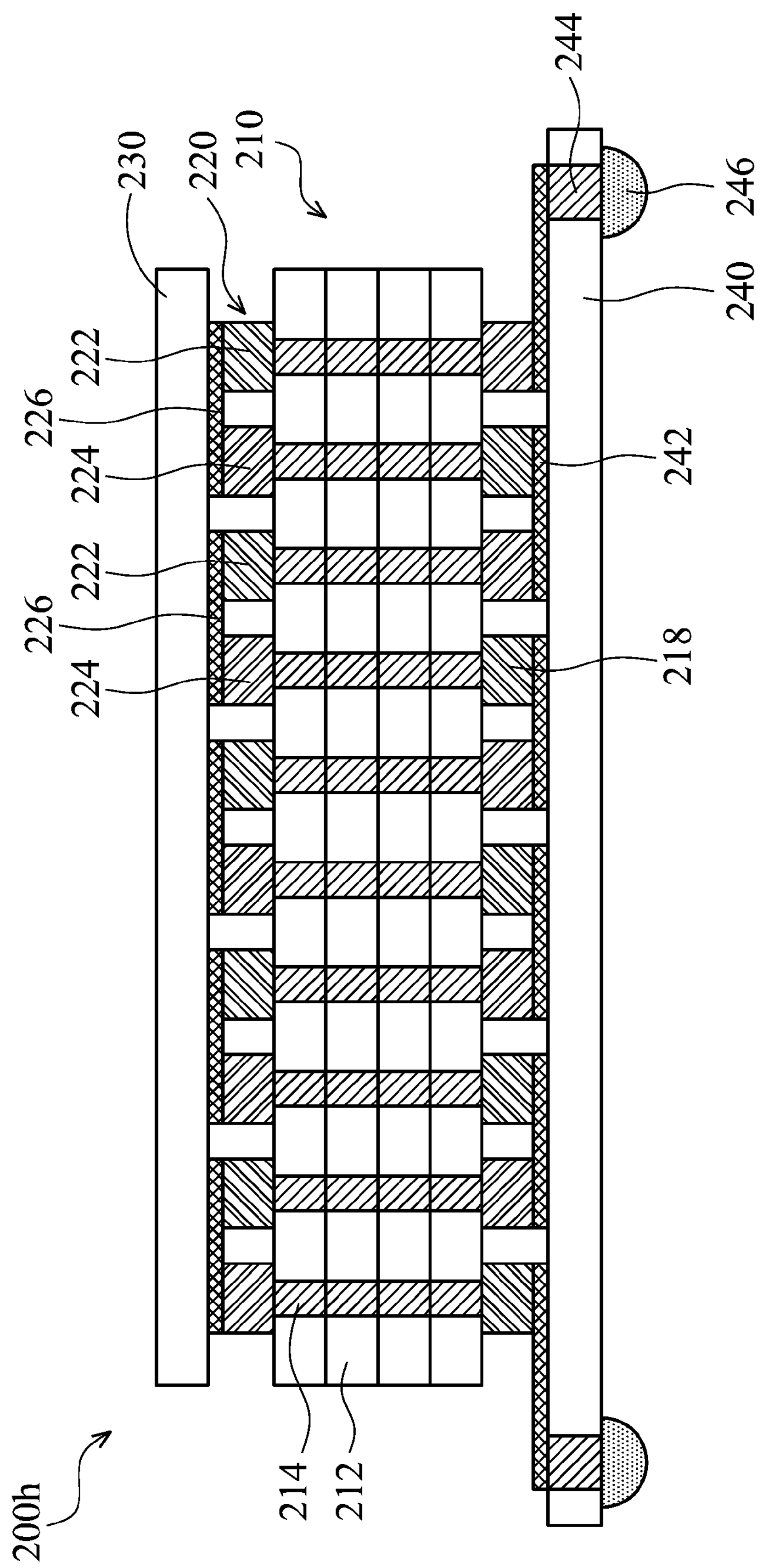

FIGS. 2 to 9 are cross sections schematically illustrating embodiments of the package structures 200*a*-200*h* for integrating a thermoelectric component with a stack of chips. In some embodiments, the conductive through vias penetrating chips and micro-bumps between each chip can compose an electrically connective structure among which are arranged in series or in parallel to serve as cold-end electrodes. The cold-end electrodes can further extend to an interior of the stack of chips to reduce high temperature inside the stack of chips or to eliminate hot spots due to uneven heating inside the stack of chips, as shown in FIGS. 2 to 8. Referring to embodiments as shown in FIGS. 2 to 8, the conductive through vias penetrating chips and micro-bumps between each chip can compose an electrically connective structure. The heat generated by the stacking chips can be transferred out along stacking direction of the chips to the underlying or overlying substrate. In other embodiments, depending on practical demands of the amount of stacked chips or the heat-generated locations inside of the stack of chips, the thermoelectric component can be disposed as a single-side structure as shown in FIGS. 2 to 6, or a double-side structure as shown in FIGS. 7 and 8.

Figure 2:
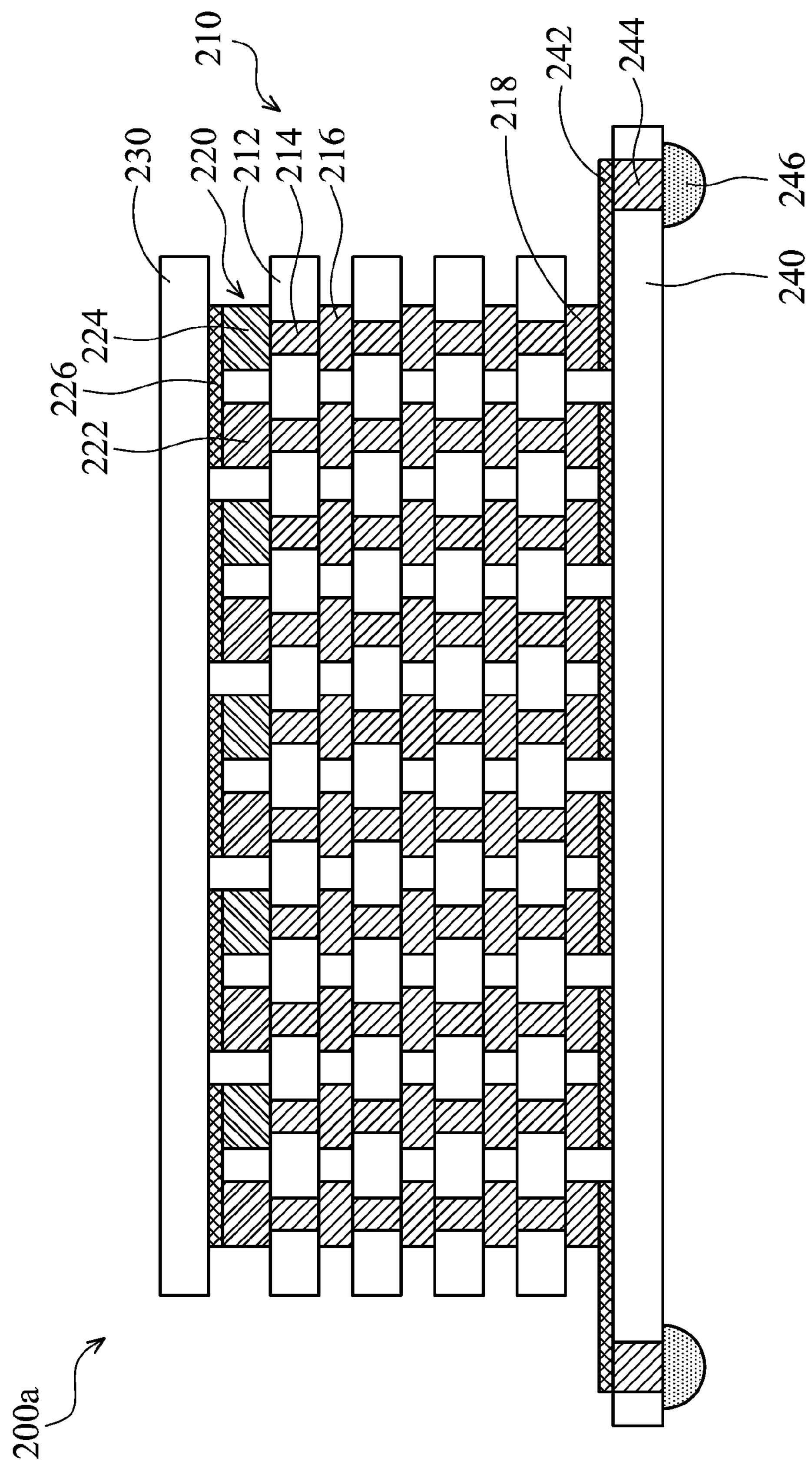
FIGS. 2 to 9 are cross sections schematically illustrating embodiments of the package structures 200*a*-200*h* for integrating a thermoelectric component with a stack of chips.

Referring to FIG. 2, a package structure 200*a* for integrating a thermoelectric component with stacking chips includes a substrate 240 such as a printed circuit board. The substrate 240 can comprise a conductive layer 242 (such as traces) on the substrate 240. The substrate 240 can also comprise a plurality of conductive through vias 244, and the conductive layer 242 may connect the through vias 244 to the solder connections 246, and an external electrical contact can be applied to the package structure 200*a* through the solder connections 246. A plurality of conductive bumps 218 can further be disposed between the stack of chips 210 and the substrate 240, and electrically connected with the conductive layer 242 or the conductive through vias 244.

A stack 210 of multi-layered chips is disposed on the substrate 240 and is electrically connected to the conductive elements (such as the conductive bumps 218, conductive layers 242 or conductive through vias 244). The stack 210 of multi-layered chips includes a chip stack laminated with chips. Each chip 212 has conductive through vias 214 (such as a TSV). The through vias 214 of adjacent chips are connected by conductive bumps 216. A thermoelectric component 220 is disposed on the stack 210 of multi-layered chips and corresponds to and is connected to the conductive through vias 214. For example, the thermoelectric component 220 comprises a first type conductive thermoelectric element 222 (such as an N-type semiconductor element) and a second type conductive thermoelectric element 224 (such as a P-type semiconductor element). The first and second type conductive thermoelectric elements 222, 224 and a conductive layer 226 compose a conductive path serving as a thermoelectric current route for transferring out the heat generated in the chip stack. In another embodiment, a hot-end substrate 230 is disposed on the thermoelectric component 220. The hot-end substrate 230 can comprise materials with high thermal conductivity and with electrical isolation, such as silicon, $Al_2O_3$, or AlN.

Figure 3:
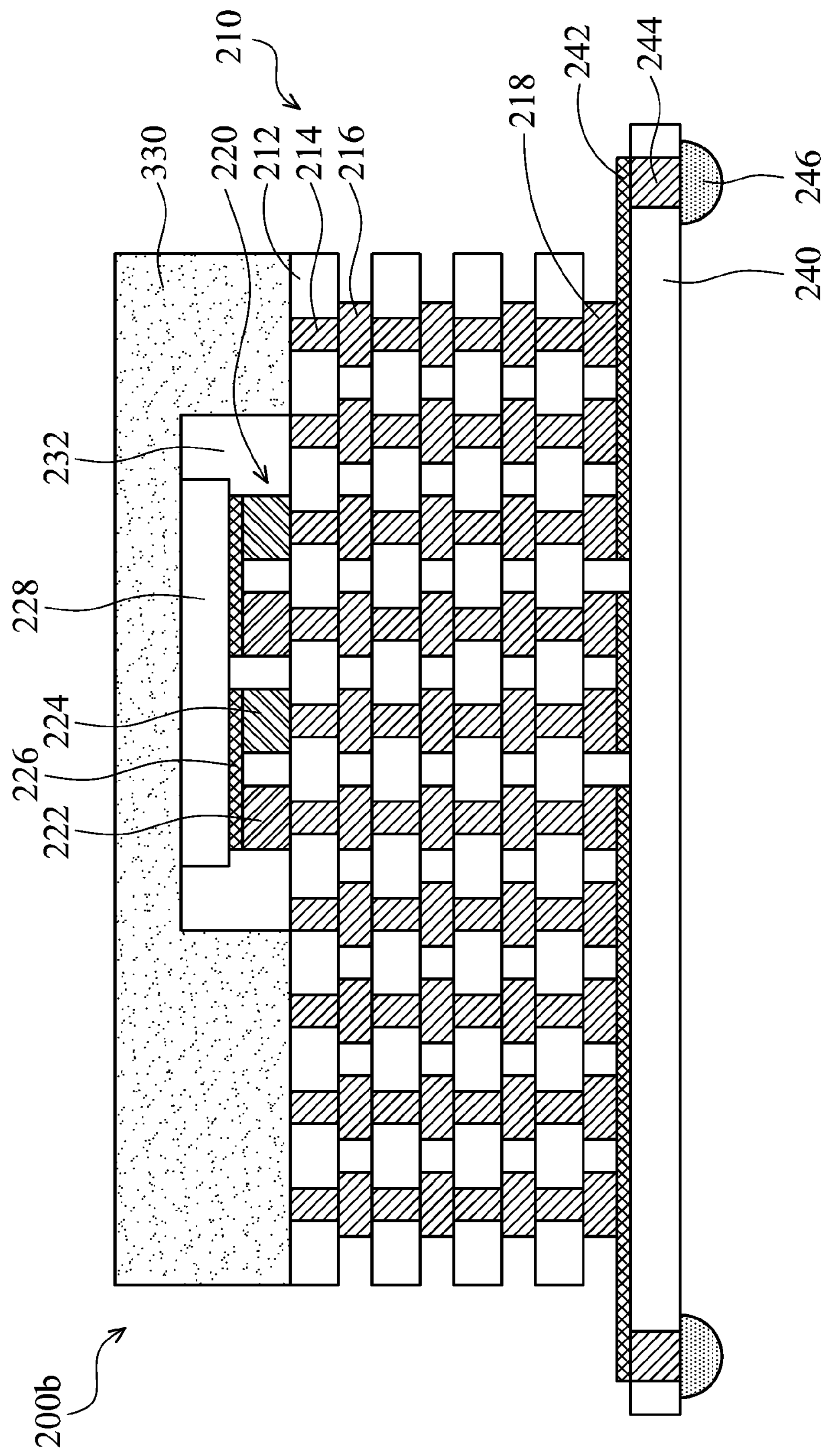

Referring to FIG. 3, an embodiment of the package structure 200*b* for integrating thermoelectric components with chips is similar to the package structure 200*a* of FIG. 2 and for simplicity its detailed description is omitted. The package structure 200*b* is different from the package structure 200*a* in that the hot-end substrate 330 in FIG. 3 includes a recess cavity 232. The thermoelectric component 220 is disposed in the recess cavity 232 and is connected the hot-end substrate through a thermal conductive plate 228. In one embodiment, the thermal conductive plate 228 can comprise materials with high thermal conductivity and with electrical isolation, such as silicon, $Al_2O_3$, or AlN. In other embodiments, referring to FIG. 4, a conductive layer 342 is interposed between any adjacent chips. The conductive layer 342 connects two conductive bumps 216, thereby creating a thermoelectric current path through the conductive through vias and the conductive element. The thermoelectric current path can serve as a cold-end electrodes route of the thermoelectric component to effectively transfer out heat generated from the chip.

According to embodiments of the application, the thermoelectric component 220 is not limited to be interposed between the stack 210 of multi-layered chips and the hot-end substrate 230. For example, in another embodiment, the package structure further comprises an additional thermoelectric component 320 comprising a first type conductive thermoelectric element 322 (such as an N-type semiconductor element) and a second type conductive thermoelectric element 324 (such as a P-type semiconductor element). The first and second type conductive thermoelectric elements 322, 324 and a conductive layer 326 compose a conductive path serving as a thermoelectric current route which is interposed between the stack 210 of multi-layered chips and the substrate 240, as shown in the package structure 200*f* for integrating thermoelectric components with a stack of chips of FIG. 7.

Referring to FIG. 5, a package structure 200*d* for integrating thermoelectric components with chips includes a substrate 240 such as a printed circuit board. A stack 210 of multi-layered chips is disposed on the substrate 240. The stack 210 of multi-layered chips includes a chip stack laminated with several chips. Each chip has conductive through vias 214. The through vias of adjacent chips are connected by conductive bumps 216. A thermoelectric component 220 is interposed between the stack 210 of multi-layered chips and the substrate 240. The thermoelectric component 220 comprises a first type conductive thermoelectric element 222 (such as an N-type semiconductor element) and a second type conductive thermoelectric element 224 (such as a P-type semiconductor element). The first and second type conductive thermoelectric elements 222, 224 and a conductive layer 226 (such as traces on the substrate 240) compose a conductive path. The first and second type conductive thermoelectric elements 222 and 224 are disposed correspond to and electrically connect to the conductive through vias 214. A conductive layer 328 is disposed on the other side of the stack 210 of multi-layered chips opposite to the substrate 240 and being connected to the pair of conductive through vias 214. The conductive layer 328, the conductive through vias 214, and the conductive bumps 216 can compose a thermoelectric current route serving as a cold-end electrode route of the thermoelectric component. In this embodiment, since the substrate 240 can serve as a hot-end substrate, the hot-end substrate 230 of the abovementioned embodiments can thus be omitted, thereby reducing thickness of the package structures. Furthermore, a conductive layer 328 can be optionally formed on a local region between the conductive through vias 214 such that the cold-end electrode route of the thermoelectric component merely passes the local region inside of the stack 210 of multi-layered chips, as shown in the package structure 200*e* for integrating thermoelectric components with chips of FIG. 6.

Figure 4:
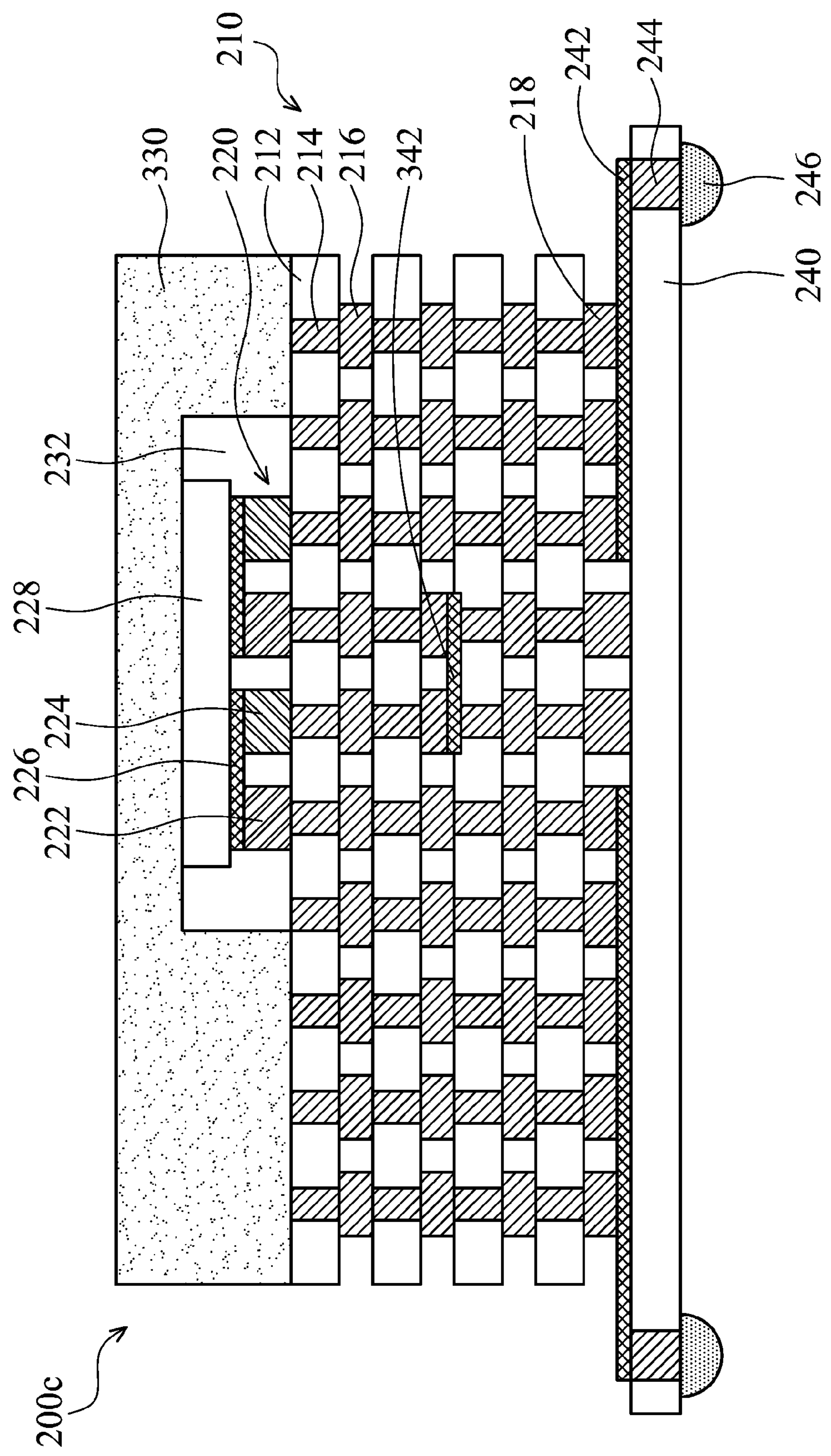

Note that, the package structures 200*b*, 200*c*, and 200*e* disclosed in the embodiments of FIGS. 3, 4 and 6 comprises two kinds of electrical current routes. One kind of electrical current route is formed from the thermoelectric elements and the conductive elements electrically connected with the thermoelectric elements for transferring heat outward, and the other kind is applied due to operation for the IC chips.

Referring to FIG. 8, a package structure 200*g* integrating a thermoelectric component with chips includes a substrate 240 such as a printed circuit board. A stack 210 of multi-layered chips includes a chip stack laminated with several chips. Each chip 212 has conductive through vias 214 penetrating the chips. The conductive through vias of adjacent chips are connected by conductive bumps 216. A thermoelectric component 420 includes several first type conductive thermoelectric elements 422 and second type conductive thermoelectric elements 424 respectively disposed on the upper and lower sides of the stack 210 of multi-layered chips, and each conductive thermoelectric element is located corresponding to and connecting to one conductive through via 214. A hot-end substrate 230 is disposed on the stack 210 of multi-layered chips. The first type conductive thermoelectric elements 422 are disposed between the hot-end substrate 230 and the stack 210 of multi-layered chips. A conductive layer 426 is disposed on the hot-end substrate 230 and connects the thermoelectric elements 422. The second type conductive thermoelectric elements 424 are disposed between the substrate 240 and the stack 210 of multi-layered chips and are connected by another conductive layer 428 on the substrate 240. The hot-end substrate 230 can comprise materials with high thermal conductivity and with electrical isolation, such as silicon, $Al_2O_3$, or AlN.

It should be understood that the abovementioned embodiments of the package structures for integrating a thermoelectric component with stacking chips include electrode structures for electrically connecting the thermoelectric components formed on one side of a substrate. The combination of the substrate and the thermoelectric components is generally constructed as a hot-end electrode. The combined structure is aligned with and electrically connected with the conductive through vias of the chips. The conductive through vias of the chips and the micro-bumps between chips can compose cold-end electrode structures of the package structures. The cold-end electrode structures can extend to an interior area of the stack of multi-layered chips, thereby transferring out heat through the conductive through vias and the micro-bumps. Moreover, the packaged structure can be alternatively or optionally used in a single-side configuration or a double-side configuration. Accordingly, embodiments of the packaged structures for integrating thermoelectric components with a stack of multi-layered chips use conductive through vias and/or conductive micro-bumps to serve as cold-end electrode structures. The cold-end electrodes can extend through the stack of multi-layered chips for increasing heat dissipation efficiency of the packaged structures. In the abovementioned embodiments, the conductive through vias are essential features for cold-end electrode structures, while the conductive micro-bumps can be optional and alternative as shown in embodiments of the package structures 100*b* and 200*h* of FIG. 1B and FIG. 9.

Furthermore, in the abovementioned embodiments, all of or part of the conductive through vias can not only conduct electrical current for operating the IC chips but also conduct thermal current for transferring heat generated by the chip.

While the disclosure has been described by way of example and in terms of the embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A package structure, comprising:

a chip with a pair of conductive through vias;

a conductive element disposed on one side of the chip contacting the pair of conductive through vias;

a thermoelectric component disposed on the other side of the chip, wherein the thermoelectric component comprises a first type conductive thermoelectric element and a second type conductive thermoelectric element respectively corresponding to and electrically connecting to the pair of conductive through vias; and a substrate disposed on the thermoelectric component, wherein the thermoelectric component, the pair of conductive through vias and the conductive element form a thermoelectric current path, wherein the first type conductive thermoelectric element is P-type and the second type conductive thermoelectric element is N-type.

2. The package structure as claimed in claim 1, wherein the conductive element comprises a pair of conductive bumps respectively corresponding to and electrically connecting to the pair of conductive through vias, and wherein the pair of conductive bumps is connected by a conductive layer.

3. The package structure as claimed in claim 1, wherein the conductive element directly contacts and electrically connects to the pair of conductive through vias.

4. A package structure, comprising:

a substrate having a conductive element thereon;

a stack of multi-layered chips disposed on the substrate and electrically connected to the conductive element, wherein each chip of the stack of multi-layered chips has a plurality of conductive through vias, and wherein at least two of the conductive through vias of adjacent chips are connected by a first conductive bump;

a thermoelectric component disposed on the stack of multi-layered chips corresponding to and electrically connecting to the conductive through vias; and a hot-end substrate disposed on the thermoelectric component, wherein the thermoelectric component comprises a first type conductive thermoelectric element and a second type conductive thermoelectric element respectively corresponding to and electrically connecting to the conductive through vias, and the first type conductive thermoelectric element is P-type and the second type conductive thermoelectric element is N-type.

5. The package structure as claimed in claim 4, wherein the conductive element comprises a plurality of second conductive bumps respectively corresponding to and electrically connecting to the conductive through vias, and wherein at least one of the second conductive bumps is connected by a first conductive layer.

6. The package structure as claimed in claim 4, wherein the hot-end substrate comprises materials with high thermal conductivity and with electrical isolation.

7. The package structure as claimed in claim 4, wherein the hot-end substrate comprises silicon, $Al_2O_3$, or AlN.

8. The package structure as claimed in claim 4, wherein the hot-end substrate comprises a recess cavity and the thermoelectric component is disposed in the recess cavity.

9. The package structure as claimed in claim 8, further comprising a thermal conductive plate and the thermoelectric component is connected the hot-end substrate though the thermal conductive plate.

10. The package structure as claimed in claim 4, further comprising a second conductive layer disposed between adjacent chips, and wherein the second conductive layer connects two first conductive bumps.

11. The package structure as claimed in claim 4, further comprising an additional thermoelectric component disposed between the stack of multi-layered chips and the substrate.

12. A package structure, comprising:

a substrate;

a stack of multi-layered chips disposed on the substrate, wherein each chip of the stack of multi-layered chips has a plurality of conductive through vias, and wherein at least two of the conductive through vias of adjacent chips are connected by a first conductive bump;

a thermoelectric component disposed between the stack of multi-layered chips and the substrate corresponding to and electrically connecting to the conductive through vias; and a conductive layer disposed on the other side of the stack of multi-layered chips and electrically connected to the conductive through vias, wherein the thermoelectric component comprises a first type conductive thermoelectric element and a second type conductive thermoelectric element respectively corresponding to and electrically connecting to the conductive through vias, and the first type conductive thermoelectric element is P-type and the second type conductive thermoelectric element is N-type.

13. The package structure as claimed in claim 12, wherein the substrate is a hot-end substrate.

14. A package structure, comprising:

a first substrate;

a stack of multi-layered chips disposed on the first substrate, wherein each chip of the stack of multi-layered chips has a plurality of conductive through vias, and wherein two of the conductive through vias of adjacent chips are electrically connected;

a thermoelectric component comprising first type conductive thermoelectric elements and second type conductive thermoelectric elements, wherein the conductive thermoelectric elements are disposed on the upper and lower sides of the stack of multi-layered chips and respectively corresponding to and electrically connecting to the conductive through vias;

a second substrate disposed on the stack of multi-layered chips; and wherein the conductive thermoelectric elements disposed between the first substrate and the stack of multi-layered chips are connected by a first conductive layer, and wherein the conductive thermoelectric elements disposed between the second substrate and the stack of multi-layered chips are connected by a second conductive layer, wherein the first type conductive thermoelectric elements are P-type and second type conductive thermoelectric elements are N-type.

15. The package structure as claimed in claim 14, wherein the second substrate comprises silicon, $Al_2O_3$, or AlN.

16. The package structure as claimed in claim 14, wherein two of the conductive through vias of adjacent chips of the stack of multi-layered chips are connected by a first conductive bump.

* * * * *